(12) United States Patent
Jung

(10) Patent No.: US 7,808,095 B2
(45) Date of Patent: Oct. 5, 2010

(54) ULTRA SLIM SEMICONDUCTOR PACKAGE AND METHOD OF FABRICATING THE SAME

(75) Inventor: Gi-Jo Jung, Incheon-si (KR)

(73) Assignee: Nepes Corporation, Chungbuk (KR)

( * ) Notice: Subject to any disclaimer, the term of this patent is extended or adjusted under 35 U.S.C. 154(b) by 0 days.

(21) Appl. No.: 12/023,839

(22) Filed: Jan. 31, 2008

(65) Prior Publication Data
US 2009/0008762 A1    Jan. 8, 2009

(30) Foreign Application Priority Data
Jul. 2, 2007    (KR)    ............. 10-2007-0066034

(51) Int. Cl.
H01L 23/02    (2006.01)
(52) U.S. Cl. ............. 257/686; 438/109
(58) Field of Classification Search ........... 257/687, 257/686
See application file for complete search history.

(56) References Cited

U.S. PATENT DOCUMENTS

| | | | | |
|---|---|---|---|---|
| 6,597,070 | B2 * | 7/2003 | Miyazaki | 257/778 |
| 2004/0012085 | A1 * | 1/2004 | Shioga et al. | 257/723 |
| 2006/0063312 | A1 * | 3/2006 | Kurita | 438/127 |
| 2006/0171698 | A1 * | 8/2006 | Ryu et al. | 396/114 |
| 2007/0059862 | A1 * | 3/2007 | Eng et al. | 438/109 |
| 2008/0136004 | A1 * | 6/2008 | Yang et al. | 257/686 |
| 2008/0237834 | A1 * | 10/2008 | Hu et al. | 257/693 |

FOREIGN PATENT DOCUMENTS

| KR | 1020010002843 | 1/2001 |
|---|---|---|
| KR | 1020040060843 | 7/2004 |

* cited by examiner

*Primary Examiner*—Thao X Le
*Assistant Examiner*—Kimberly Trice (57) ABSTRACT

There is provided an ultra slim semiconductor package comprising: a multilayer thin film layer including at least one or more dielectric layers and at least one or more redistribution layers; at least one semiconductor chip electrically connected to the redistribution layer and mounted on the multilayer thin film layer; conductive structures electrically connected to the redistribution layer and each formed in a post shape at one side of the multilayer thin film layer; a molding part formed on the multilayer thin film layer and at least partially covering the conductive structures and the semiconductor chip; and bumps for external connection formed on the molding part and electrically connected to the conductive structures. The semiconductor package according to the present invention enables mass production at wafer level, is easily stacked between the packages, and has an excellent electrical characteristic. Further, since the package thickness is very thin, the semiconductor package contributes to the slimming of diverse electronic products.

10 Claims, 10 Drawing Sheets

ULTRA SLIM SEMICONDUCTOR PACKAGE AND METHOD OF FABRICATING THE SAME

RELATED APPLICATIONS

This application is a U.S. national phase application of Korean Patent Application No. 2007-066034, filed Jul. 2, 2007, the contents of which are incorporated herein by reference in their entirety.

FIELD OF THE INVENTION

The present invention relates to an ultra slim semiconductor package and a method of fabricating the same, and more particularly, to a light, thin, short and small semiconductor package which does not use a substrate for a package, and a method of fabricating the same at wafer level or carrier level.

BACKGROUND OF THE INVENTION

A semiconductor device is capable of realizing diverse operation by a number of electric devices integrated in a single substrate. For this purpose, various high-technical fabrication methods have been used, and each device in semiconductor device fabrication has been developed to be miniaturized as a component in smaller dimensions.

Semiconductor systems of high-integration and high-capacity have been proposed by developing the technology of packaging semiconductor devices. The semiconductor packaging technology has been changed from a wire bonding to a flip-chip bumping capable of realizing a chip scale, to meet the market requirements.

Figure 1:
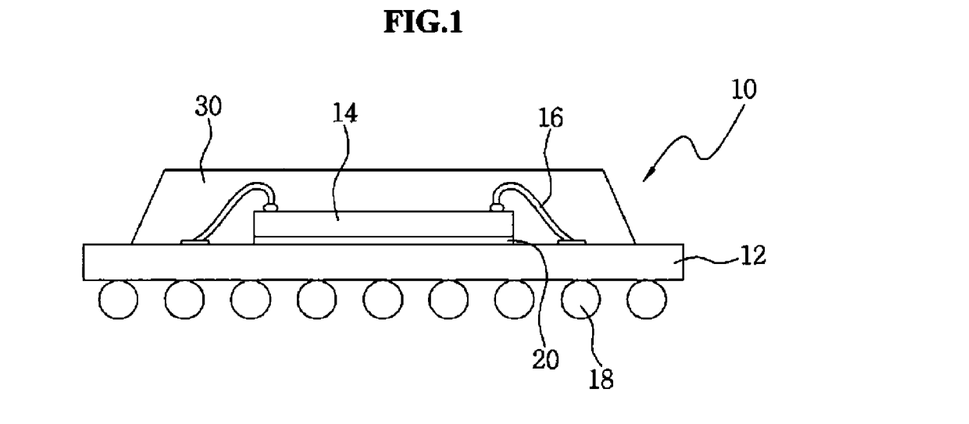
FIG. 1 is a sectional view of a conventional semiconductor package structure.

FIG. 1 is a sectional view illustrating an example of a structure of a conventional ball grid array (BGA) package 10. An individual semiconductor chip 14 is bonded to one side of a substrate 12 for a package by a bonding layer 20, and a part of the semiconductor chip is electrically connected to a part of the substrate by a wire 16. A number of solder bumps 18 are formed on the bottom side of the substrate, and a protecting molding 30 to cover the semiconductor chip and the wire is formed on the top side of the substrate.

As described above, in the conventional art, a substrate with a predetermined thickness is needed for the package of the semiconductor chip. When the semiconductor chip operates, signals are transferred through the electrical interconnection from the wire formed on the top side of the substrate to the solder bumps formed on the bottom side of the substrate. However, as a semiconductor device has been developed, the operation speed of the semiconductor device has been remarkably improved. Then, when an interconnection length within a package is long, a signal is delayed or a distortion is serious upon high-speed operation or high-capacity signal process, thereby failing to satisfy the requirements for various application devices.

Moreover, since the substrate of a predetermined thickness is needed for a package, there are limits in reducing the size and thickness of the whole package. Consequently, the substrate becomes an obstacle in developing communication devices or electronic devices to be small or slim.

Moreover, the conventional BGA package technology has a limit in realizing diverse stacked packages or systemized packages and is not effective in mass production.

Therefore, the present invention is directed to provide a new semiconductor package which is very thin in thickness and simple in structure and which is easily stacked.

Another object of the present invention is to provide a semiconductor package which has a short electrical interconnection length, to be favorable for high speed operation.

Another object of the present invention is to provide a method of fabricating a semiconductor package, which is favorable in mass production and has a simple process.

In accordance with an aspect of the present invention, the present invention provides an ultra slim semiconductor package comprising: a multilayer thin film layer including at least one dielectric layer and at least one or more conductive redistribution layers; at least one semiconductor chip electrically connected to the redistribution layer and mounted on the multilayer thin film layer; conductive structures electrically connected to the redistribution layer and each formed in a post shape at one side of the multilayer thin film layer; a molding part formed on the multilayer thin film layer and at least partially covering the conductive structures and the semiconductor chip; and bumps for external connection or an electrode terminal for external connection formed on the molding part and electrically connected to the conductive structures.

The semiconductor chip may be electrically connected to the multilayer thin film layer by additional separate solder bumps, and in this case, the solder bumps are electrically connected to the conductive structures of the multilayer thin film layer by the redistribution layer.

Alternatively, one side of the semiconductor chip may be directly mounted on the top side of the multilayer thin film layer by die attachment. In this case, an electrode pad is formed at the other side of the semiconductor chip, and the electrode pad is electrically connected to the conductive structures of the multilayer thin film layer by the redistribution layer.

In the semiconductor package according to the present invention, the semiconductor chip is mounted in a face up type. The bottom side of the semiconductor chip may be exposed to the outside or added with a thermal conductive layer, so that heat can be easily spread out.

Further, the interconnection length from the electrode pad of the semiconductor chip to the solder bumps for the external connection is short, so that an electrical signal transfer characteristic is very excellent.

Further, even though the solder ball which is relatively small in size is used as the external connection terminal, since it is electrically connected to the conductive structures in the post shape, stand-off height is high and mechanical reliability is excellent.

In accordance with another aspect of the present invention, the present invention provides a method of fabricating a semiconductor package, comprising steps of: forming a dielectric layer on the top side of a wafer or carrier; forming a conductive redistribution layer on the top side of the dielectric layer; forming conductive structures, each in a post shape, on the redistribution layer, mounting a semiconductor chip on the dielectric layer; forming a molding part on the redistribution layer, to at least partially cover the conductive structures and the semiconductor chip; grinding the top side of the molding part; and forming bumps for external connection so as to be electrically connected to the conductive structures.

In accordance with the fabrication method, since the package structure is maintained only by mold, without any additional substrate for the package, the package thickness is formed to be very thin and the size thereof is easily controlled. Furthermore, since the conductive redistribution layer and the conductive structures in the post shape are formed at wafer level or carrier level, the process is easy and the fabrication cost is reduced. Specifically, it is easy to stack a plurality of the packages at wafer level.

DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described more fully hereinafter with reference to the accompanying drawings, in which preferred embodiments of the invention are shown.

Figure 2:
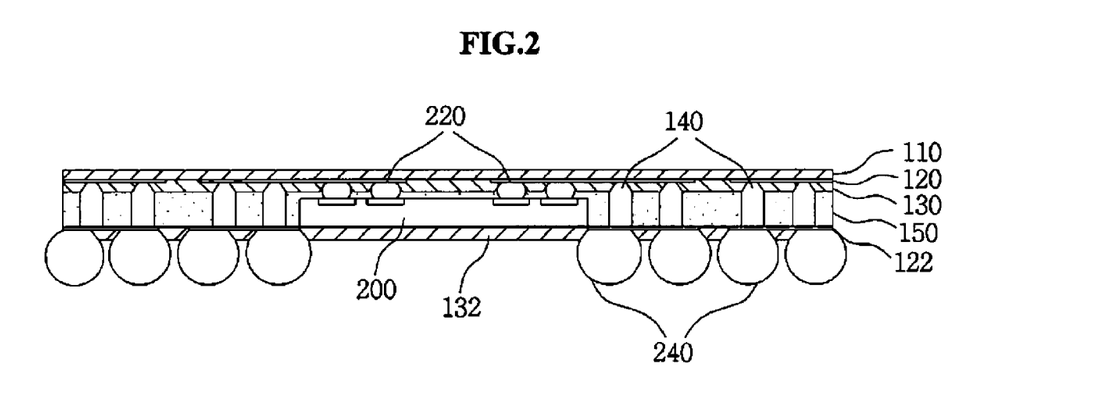
FIGS. 2 through 5 are sectional view of a semiconductor package structure according to a first embodiment of the present invention.

As illustrated in FIG. 2, a semiconductor package according to a first embodiment of the present invention has a slim package structure in which a molding part and a semiconductor chip are mounted on a multilayer thin film layer.

As illustrated, a conductive redistribution layer 120 is formed between a plurality of dielectric layers 110 and 130, and the dielectric layers and the redistribution layer 120 integrally form a multilayer thin film layer.

At one side of the multilayer thin film layer, a semiconductor chip 200 is mounted to be electrically connected to the redistribution layer 120 by solder bumps 220.

The semiconductor chip 200 is electrically connected to conductive structures 140, each formed in a post shape at one side of the multilayer thin film layer, through the redistribution layer 120, and the semiconductor chip 200 is finally electrically connected to solder bumps 240 for external connection, which are electrically connected to the conductive structures 140. The conductive structure may be formed of, for example, copper, gold, platinum, nickel, tungsten, or metal of high conductivity, or alloy thereof, and the present invention does not specifically limit the material of the conductive structure.

The conductive structures 140 and the semiconductor chip 200 formed at one side of the multilayer thin film layer are blocked from the outside by a molding part 150 which partially covers the conductive structures 140 and the semiconductor chip 200, thereby forming the semiconductor package of a physical support force and structural stability in its whole view.

Since the above-described semiconductor package does not need any separate supporting substrate, and the multilayer thin film layer, the molding part 150 and the mounted semiconductor chip 200 form one package structure, there is the structural characteristic in that the semiconductor package is light, thin, short and small. Specifically, since the length of electrical interconnection is shortened, it is very favorable for high-speed transfer of electrical signals.

On the surface of the molding part 150, another conductive redistribution layer 122 may be formed to be electrically connected to the conductive structures 140, and the solder bumps 240 for external connection are electrically connected to the conductive structures 140 through the redistribution layer 122. On the redistribution layer 122 connected to the solder bumps 240, an under bump metal (not shown) may be further formed to increase the adhesiveness of the solder bumps 240 and to prevent the solder bumps 240 from being oxidized.

At one side of the redistribution layer 122, a dielectric layer 132 is partially formed. The dielectric layer 132 functions as a protection layer to the outside, by covering one side of the semiconductor chip 200.

Figure 3:
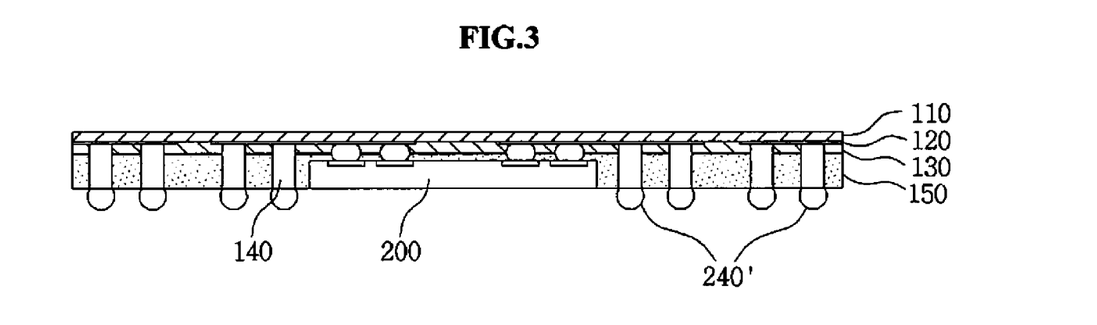

Further, the solder bumps 240 for external connection may be directly connected to the conductive structures 140. Referring to FIG. 3, the conductive structures 140 and one side of the molding part 150 are exposed to the outside, with no electric layer, and solder bumps 240' are directly connected on the surface of the conductive structure 140. Specifically, unlike the embodiment of FIG. 2, the solder bumps 240' are very small in size. Even though the solder bumps 240' being relatively small in size are used, high stand-off height is maintained by the conductive structures 140 and the solder bumps 240' are electrically connected to the semiconductor chip 200, so that the package thickness is more and more slimed.

The back side of the semiconductor chip 200 has the same height as the surface of the molding part exposed to the outside. When the back side of the semiconductor chip 200 is thinned to improve the thermal conductivity, the heat generated upon the operation of the semiconductor chip 200 is more effectively spread out to the outside. Further, preferably, the exposed sides of the molding part 150 and the conductive structures 140 may be evenly grinded, to uniformly maintain the height at which the solder bumps 240' are mounted on an external circuit board and the like.

Further, in the embodiment of FIG. 3, since the conductive structures 140 and the solder bumps 240' are electrically connected together at the same position vertically, the electrical signals are more easily transferred.

Figure 4:
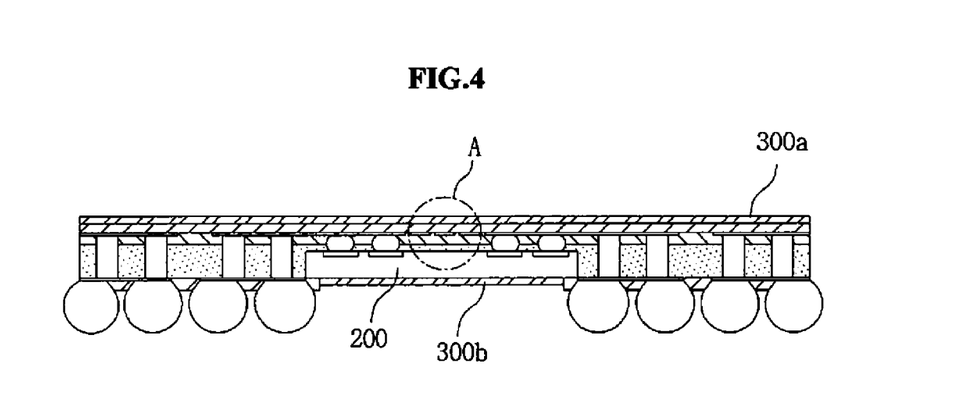

In the semiconductor package according to the embodiment of the present invention, separate heat spreaders may be positioned on the top side and the bottom side thereof. Referring to FIG. 4, a heat spreading sheet 300a is attached to the surface of the multilayer thin film layer, and another heat spreading sheet 300b is attached to the bottom side of the semiconductor chip 200. The heat spreading sheets 300a and 300b may use a material of high thermal conductivity and excellent durability and may be attached directly or by an adhesive film of high thermal conductivity.

Further, the semiconductor package according to the embodiment of the present invention may additionally comprise a thin film passive device positioned between the dielectric layers at the same time when the redistribution layer is formed. For example, referring to FIG. 4, the passive device is formed by the thin film in region A adjacent to the redistribution layer. The passive device may be, for example, an inductor or a capacitor. The multilayer thin film structure including the thin film device may be applied to the package structures of FIGS. 2 and 3 in the same manner.

Figure 5:
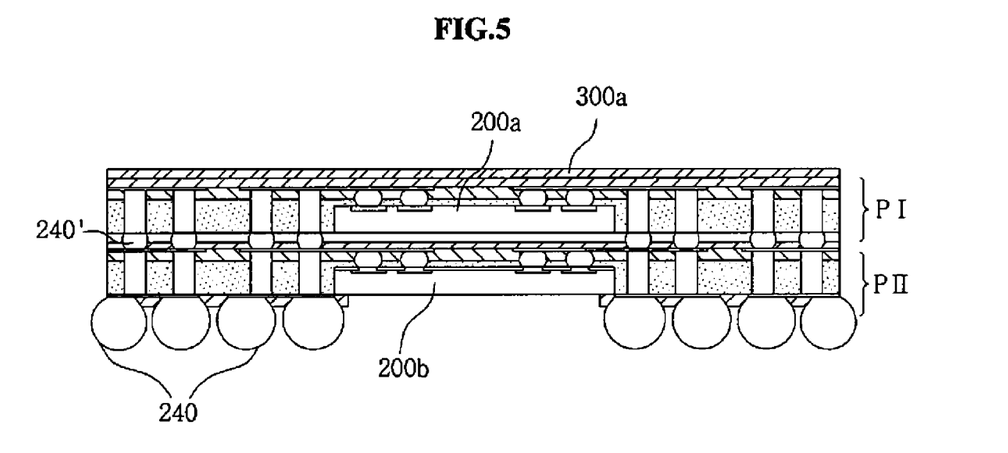

Not only the semiconductor package according to the embodiment of the present invention is light, thin, short and small, but also a number of the semiconductor packages are easily mounted on the external circuit board horizontally or stacked vertically. Referring to FIG. 5, two semiconductor packages PI and PII are stacked vertically and are electrically connected to each other by the solder bumps 240'. These semiconductor packages PI and PII may be connected to the external circuit board or another semiconductor package through the solder bumps 240' for external connection, which are formed on the bottom side of the lower package PII.

A semiconductor chip 200a is built in the upper package PI and another semiconductor chip 200b is built in the lower package PII. On the top side of the upper package PI, the heat spreading sheet 300a may be added as shown. The stacked two packages are electrically connected to each other by the solder bumps 240', and then, a stack height can be more reduced by differentiating the size of the solder bump 240' in each package as illustrated. Further, since one side of the semiconductor chip 200 built in each package is exposed to the outside, the heat being generated more and easily comes out.

A method of fabricating the semiconductor package according to the first embodiment of the present invention will be described with reference to FIGS. 6 through 16.

A temporary substrate for package fabrication, a wafer carrier as well as an ordinary semiconductor wafer may be used. The temporary substrate is removed during the process of fabricating the semiconductor package, and the actual package secures the mechanical support force and the structural stability by its own structure, without the substrate.

Figure 6:
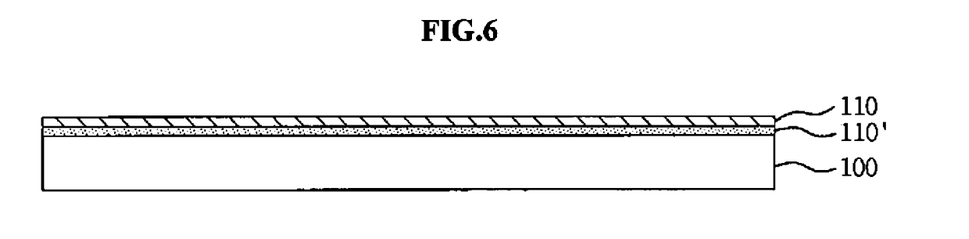
FIGS. 6 through 16 are sectional views of a process of fabricating the semiconductor package according to the first embodiment of the present invention.
Figure 7:
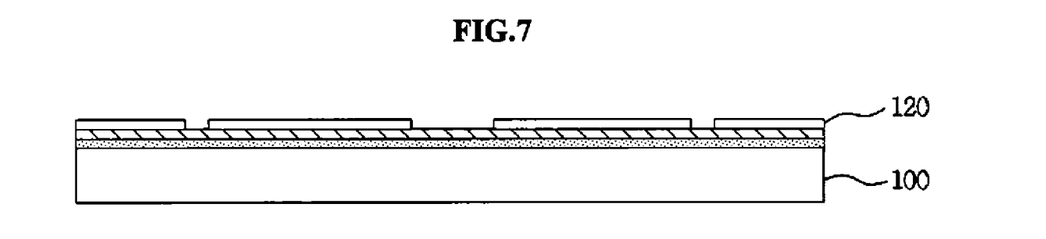

Referring to FIG. 6, a dielectric layer 110 including a bonding layer 110' is formed on a wafer (or carrier) 100. A conductive redistribution layer 120 or an electrode pad is formed on the dielectric layer 110 (FIG. 7). The redistribution layer may be formed by, for example, plating, and the method of forming the redistribution layer is not limited. When the redistribution layer is formed, the thin film passive device may be realized by forming a partial electrode pattern, as illustrated in FIG. 4.

Figure 8:
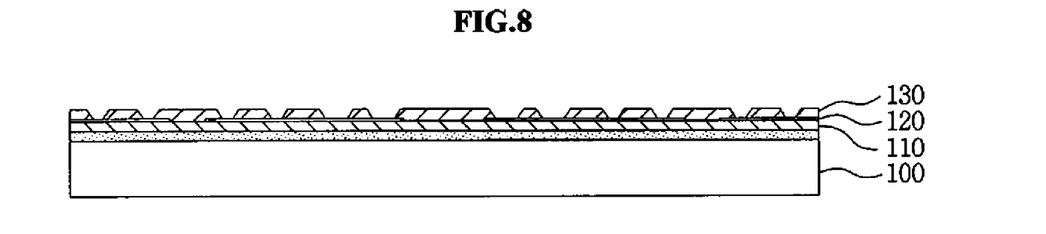

After the redistribution layer 120 is formed, another dielectric layer 130 is formed on the redistribution layer 120. The dielectric layer 130 is partially etched to partially expose the redistribution layer 120 (FIG. 8). The exposed part corresponds to the region for the electrical connection between the redistribution layer 120 (or electrode pad) and the other electrical elements. The dielectric layers 110 and 130 and the redistribution layer 120 form a multilayer thin film layer and act as a base layer of the semiconductor package of the present invention.

Figure 9:
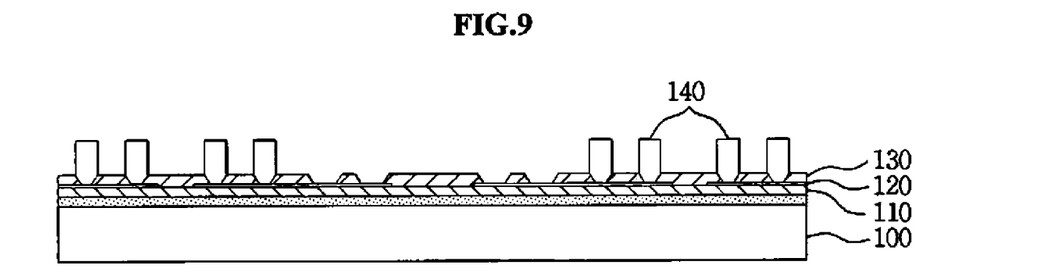

Subsequently, on the exposed part of the dielectric layer 130, conductive structures 140 in a post shape are formed (FIG. 9). Preferably, the conductive structures 140 may be formed of a conductive material, for example, such as copper, and these may be formed to be greater in height than width, that is, so that an aspect ratio is greater.

Figure 10:
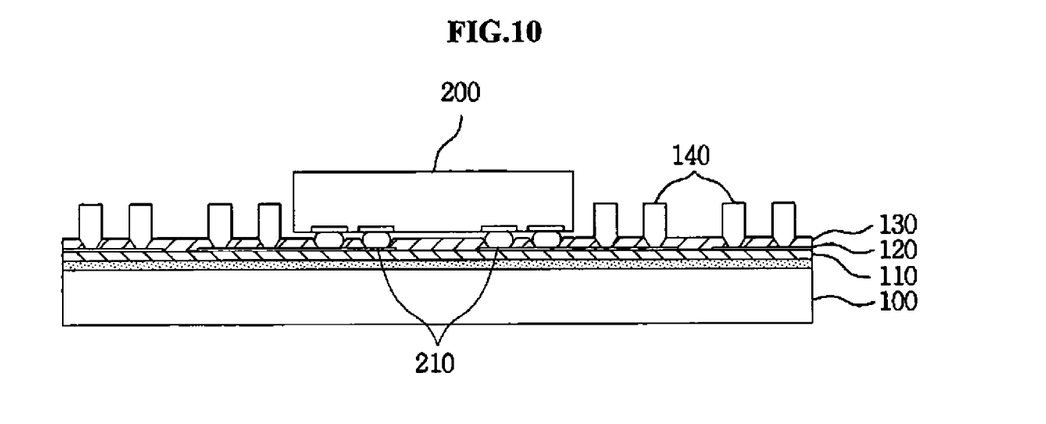

After the conductive structures 140 are formed, a semiconductor chip 200 is mounted on the exposed part of the redistribution layer 120 (FIG. 10). The process of mounting the semiconductor chip 200 is performed, for example, by arranging the semiconductor chip 200 having an excellent operation characteristic, which is selected through a test, on the multilayer thin film layer at wafer level or carrier level. Solder bumps 210 may have been formed at one side of the semiconductor chip 200. Otherwise, the semiconductor chip 200 may be mounted by forming the solder bumps 210 on the electrode pad of the conductive redistribution layer 120 of the multilayer thin film layer.

Inside the semiconductor chip 200, there may be included a number of thin film devices (not shown), for example, such as a transistor, a diode and electrical interconnection. The semiconductor chip 200 may be a memory or a logic circuit.

Figure 11:
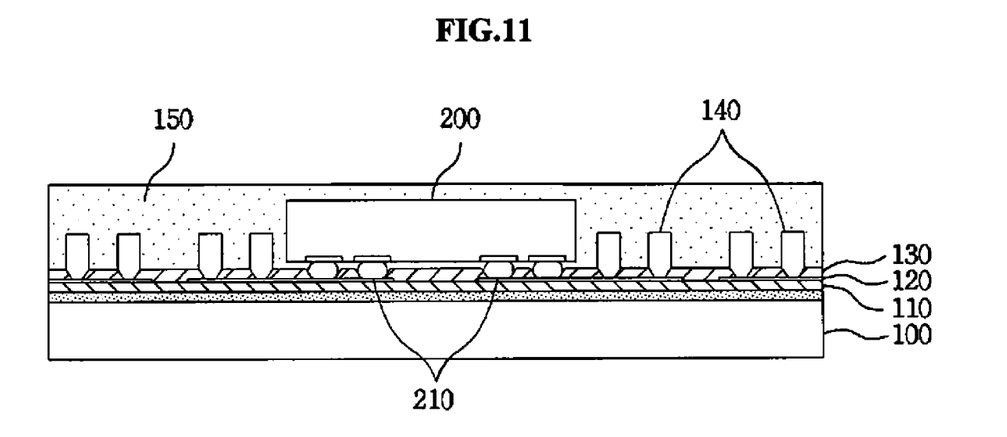

On the multilayer thin film layer where the conductive structures 140 are formed and the semiconductor chip 200 is mounted, a molding material is coated to form a molding part 150 covering the conductive structures and the semiconductor chip (FIG. 11). The molding part 150 supports the other elements so that the semiconductor package of the present invention becomes one structure with the physical stability.

Figure 12:
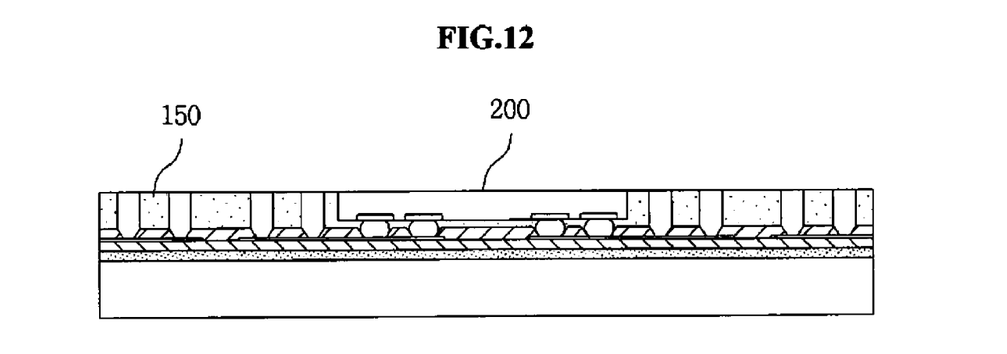

To minimize the package thickness, preferably, the molding part 150 may be layered to only as high as the heights of the conductive structures 140 and the semiconductor chip 200. For this purpose, the top side of the molding part is back-grinded, to expose the top parts of the conductive structures 140 and semiconductor chip 200 (FIG. 12). In this process, the top side of the semiconductor chip 200 may be grinded to more reduce the whole package thickness.

Figure 13:
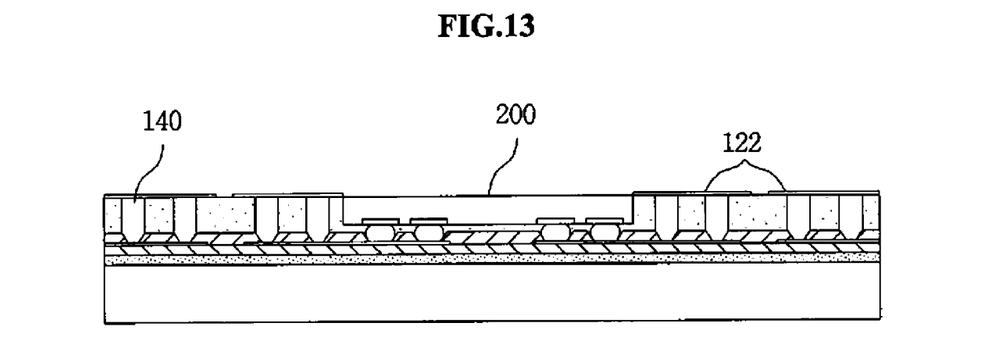

Subsequently, another redistribution layer (or electrode pad) 122 is formed on the surface of the molding part, by using the top sides of the conductive structures exposed on the surface of the molding part (FIG. 13).

Figure 14:
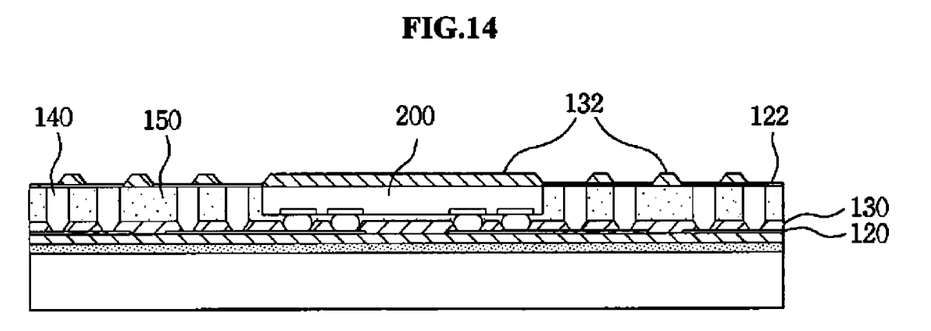

Another dielectric layer 132 is formed on the surface of the molding part 150 where the redistribution layer 122 is formed, and the dielectric layer 132 is partially removed at the positions where solder bumps 240 are to be formed, to partially expose the redistribution layer 122 (FIG. 14).

In the present invention, each of the dielectric layers 110, 130 and 132 may be formed of a dielectric material, for example, polyimide, BCB, silicon oxide, or silicon nitride, and the redistribution layers 120 and 122 may be formed of a material, such as copper, gold, aluminum or tungsten. However, each may be formed of other material, and the present invention does not specifically limit the material to be used.

Figure 15:
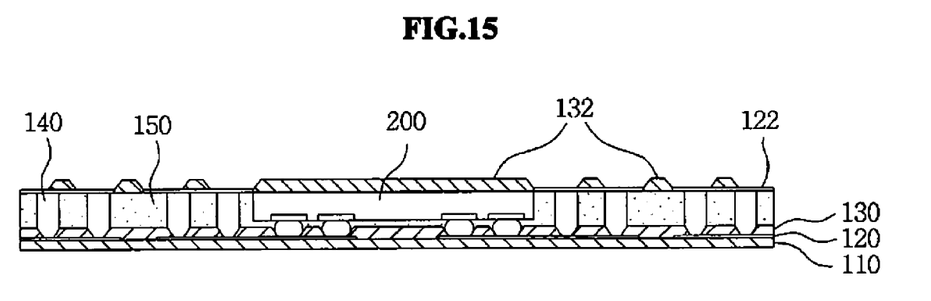
Figure 16:
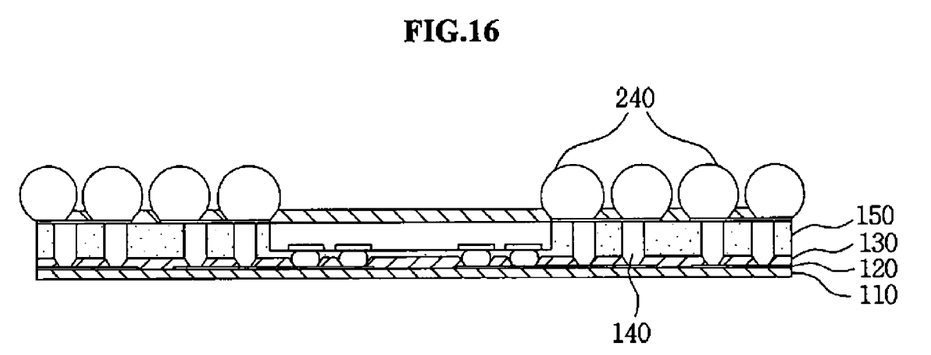

Subsequently, the wafer (or carrier) under the multilayer thin film layer on which the semiconductor chip 200 is mounted is removed from the bottom side of the multilayer thin film layer (FIG. 15). Finally, solder bumps 240 for external connection are formed on the redistribution layer 122 which is exposed by partially removing the dielectric layer 132. The solder bumps 240 may be formed by ball attaching, electroplating, electroless plating, printing or sputtering.

The wafer (or carrier) may be removed after the solder bumps 240 are formed.

Before the solder bumps 240 are formed on the redistribution layer 122, an under bump metal (UBM) (not shown) may be formed on the redistribution layer 122 to improve the adhesiveness of the solder bumps 240 and to prevent the solder bumps 240 from being oxidized. The under bump metal may include one or more layers formed of metal or alloy. The under bump metal may be formed in a structure of one layer or multiple layers including two or more layers by selecting one or more materials from, for example, copper (Cu), copper alloy (Cu-alloy), nickel (Ni), nickel alloy (Ni-alloy), tungsten (W), tungsten alloy (W-alloy), titanium (Ti), titanium alloy (Ti-alloy), aluminum (Al), aluminum alloy (Al-alloy), chrome (Cr), chrome alloy (Cr-alloy), gold (Au), gold alloy (Au-alloy), palladium (Pd), palladium alloy (Pd-alloy), antimony (Sb), antimony alloy (Sb-alloy), indium (In), indium alloy (In-alloy), bismuth (Bi), bismuth alloy (Bi-alloy), platinum (Pt) and platinum alloy (Pt-alloy).

In the above described drawings, only one individual multilayer thin film layer and one individual semiconductor chip 200 are illustrated for clarity. However, in the actual situation, a plurality of the multilayer thin film layers and a plurality of the semiconductor chips 200 are simultaneously formed and mounted at wafer level or carrier level and are separated into individual packages after the final process is completed.

Figure 17:
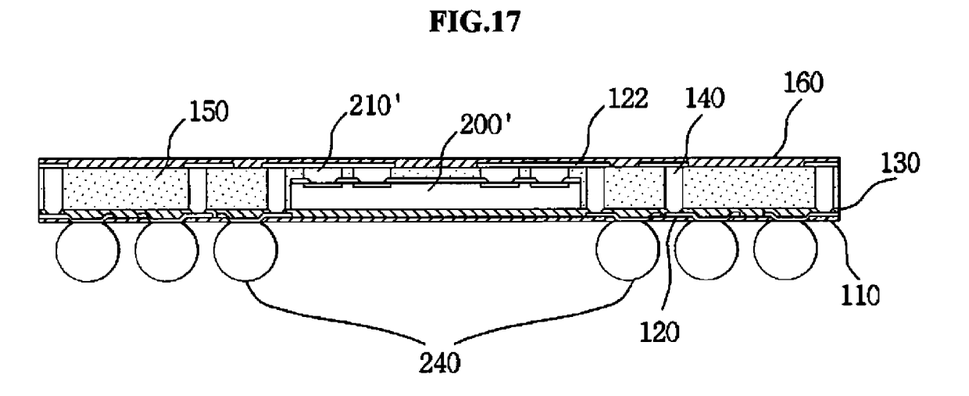
FIGS. 17 through 19 are sectional views of a semiconductor package structure according to a second embodiment of the present invention.

A semiconductor package according to a second embodiment of the present invention is illustrated in FIG. 17. Unlike the first embodiment, in the semiconductor package according to the second embodiment, one side of a semiconductor chip 200' is mounted on a multilayer thin film layer by die attachment, and no solder bumps for electrical connection are formed in the semiconductor chip 200'. Instead, electrode pads 210' are formed at the other side of the semiconductor chip 200, to be electrically connected to the other elements inside the package.

More specifically, a conductive redistribution layer 120 is formed between a plurality of dielectric layers 110 and 130, and the dielectric layers 110 and 130 and the redistribution layer 110 integrally form a multilayer thin film layer. The semiconductor chip 200' is directly attached at one side of the multilayer thin film layer.

The semiconductor chip 200' is electrically connected to conductive structures 140, each formed in a post shape at one side of the multilayer thin film layer, through the electrode pads 210' and a redistribution layer 122, and the semiconductor chip 200' is finally electrically connected to solder bumps 240 for external connection, which are electrically connected to the conductive structures 140. Reference numeral 160 denotes a dielectric layer protecting the redistribution layer 122. The electrode pads 210' may be formed in the structures being similar to, for example, the conductive structures 140, by using the same material and differentiating the height only.

Likewise, in the semiconductor package according to the second embodiment, the conductive structures 140 formed at one side of the multilayer thin film layer and the semiconductor chip 200' are partially covered by a molding part 150, and the multilayer thin film layer and the molding part 150 physically support the semiconductor chip 200', to form one package structure.

The semiconductor chip 200' directly attached on the multilayer thin film layer is of a face-up type. A part of the multilayer thin film layer formed at the bottom side of the semiconductor chip 200' may be removed to be exposed to the outside or a thermal conductive sheet may be attached to the multilayer thin film layer, to smoothly spread out the heat from the semiconductor chip 200'.

Under the multilayer thin film layer, the solder bumps 240 are formed to be electrically connected to the redistribution layer 120. An under bump metal (not shown) may be further included between the redistribution layer 120 and the solder bumps 240. Further, the semiconductor package according to the second embodiment may also form a thin film passive device (not shown) there inside and, if necessary, may include an integrated passive device (not shown) inside the molding part 150.

Figure 18:
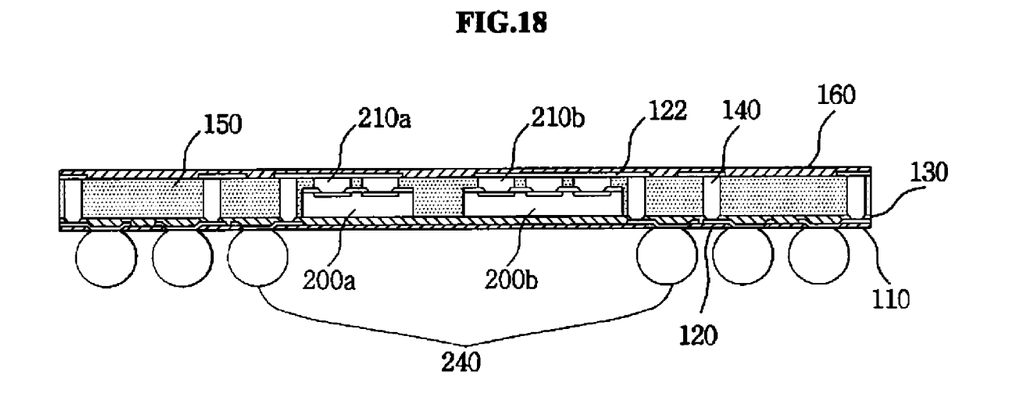

Referring to FIG. 18, two semiconductor chips 200a and 200b are mounted within one semiconductor package. Each of the semiconductor chips 200a and 200b is electrically connected to the redistribution layer 122 through each of the electrode pads 210a and 210b. The semiconductor chips 200a and 200b may be separately connected to the redistribution layer 122 through the respective conductive structures 140, so that signal transfer may be performed through an individual conductive path. Or, signal transfer may be simultaneously performed by partial electrical connection between the semiconductor chips 200a and 200b through the redistribution layer 122. Further, the semiconductor chips 200' mounted on the multilayer thin film layer may be arranged horizontally but may be arranged vertically unlike the drawing.

Figure 19:
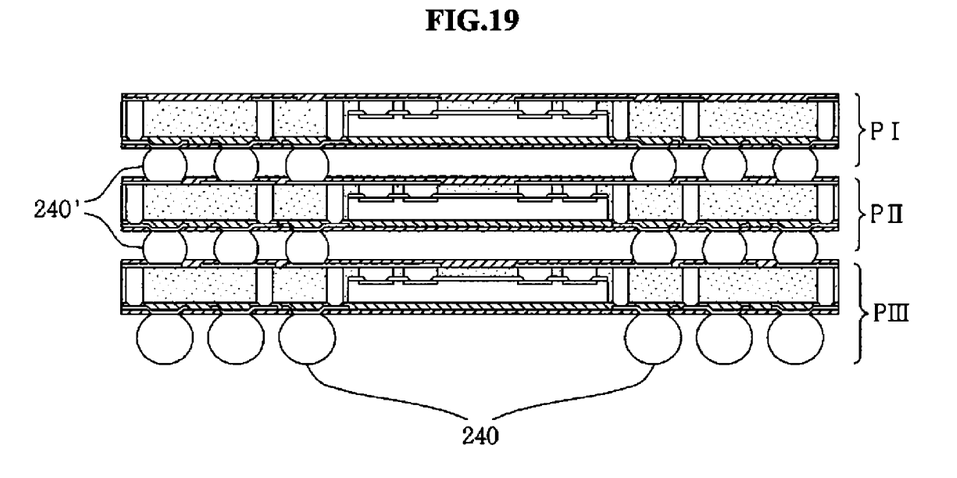

FIG. 19 illustrates an example of the semiconductor packages according to the second embodiment being vertically stacked. The stacked packages PI, PII and PIII are electrically connected to one another by the solder bumps 240'. To reduce the thickness of the stack, the solder bumps 240 and 240' which are different for each other in size may be used.

The solder bumps 240 for external circuit connection may be electrically connected to a printed circuit board or another package.

A process of fabricating the semiconductor package according to the second embodiment is similar to that of the semiconductor package according to the first embodiment but a method of mounting the semiconductor chip 200' is different in the two embodiments. Referring to FIGS. 20 through 30, the method of fabricating the semiconductor package according to the second embodiment will be described.

Figure 20:
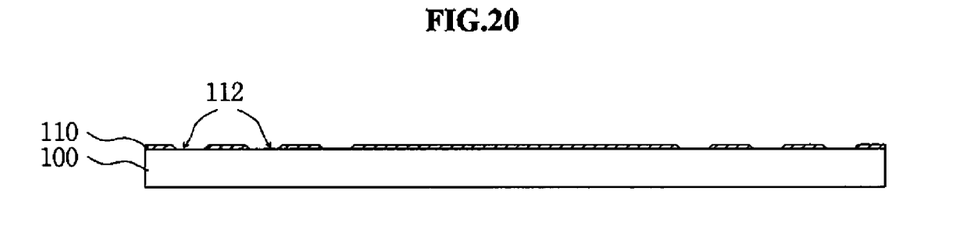
FIGS. 20 through 30 are sectional views of a process of fabricating the semiconductor package according to the second embodiment of the present invention.
Figure 21:
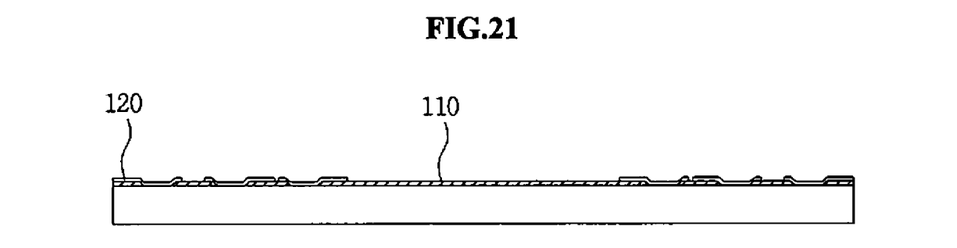

A dielectric layer 110 is formed on a wafer (or carrier) 100 and the dielectric layer is partially removed to expose a part of the wafer (FIG. 20). Subsequently, to easily remove the wafer, an adhesive film may have been formed on the wafer before the dielectric layer 110 is formed.

Figure 22:
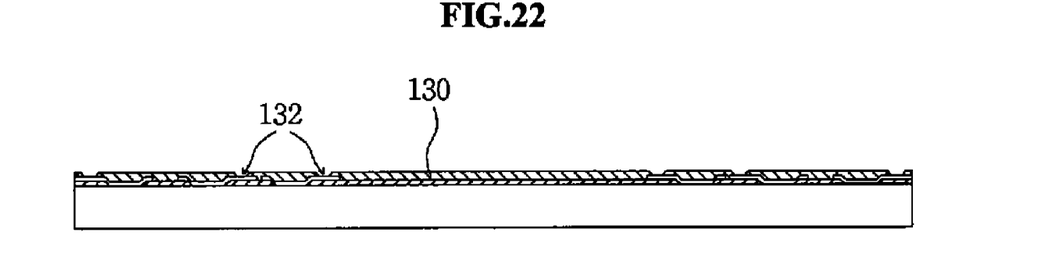
Figure 23:
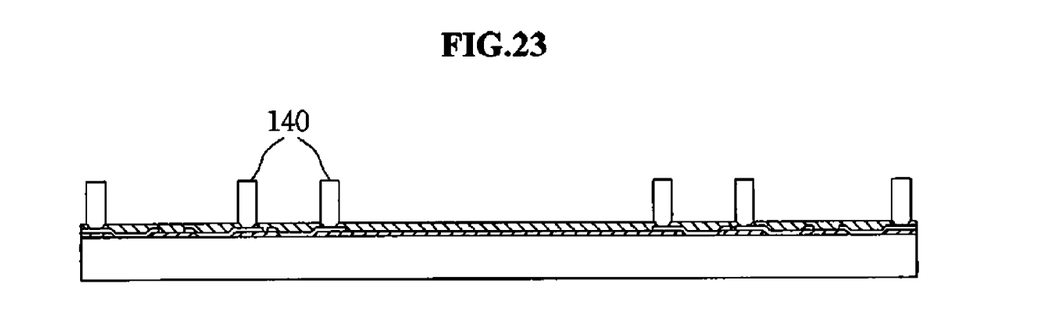

Subsequently, a redistribution layer (or electrode pad) 120 is formed at the part where the dielectric layer 110 is removed (FIG. 21), and another dielectric layer 130 is partially formed to partially expose the redistribution layer 120 (FIG. 22). The dielectric layers 110 and 130 and the redistribution layer 120 form a multilayer thin film layer and function as a base substrate for the semiconductor package according to the second embodiment. Further, the redistribution layer 120 is electrically connected to solder bumps 240 for external connection, which will be described later.

Figure 24:
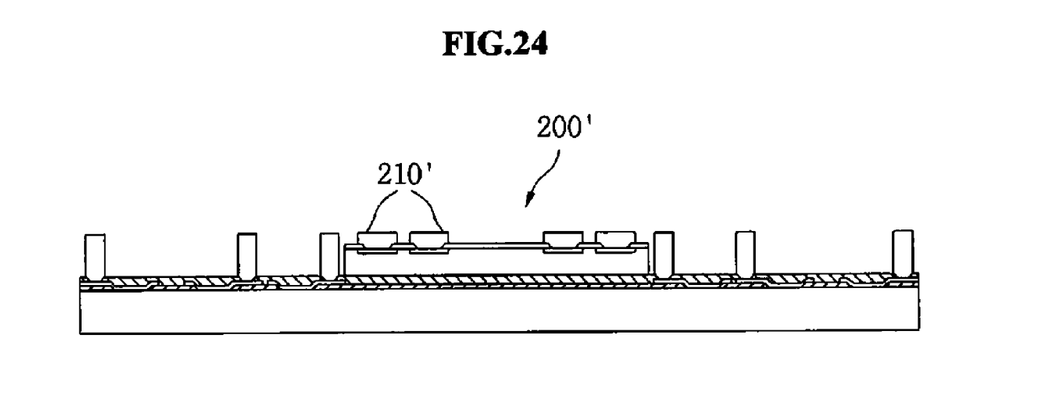

Subsequently, conductive structures 140, each in a post shape, are formed on the exposed redistribution layer 120 (FIG. 23) and a semiconductor chip 200' is attached on the top side of the multilayer thin film layer (FIG. 24). As described with reference to FIG. 18, two or more semiconductor chips may be mounted to be arranged horizontally or vertically. The electrode pads 210' may be first formed on the top side of the multilayer thin film layer. Or, after the semiconductor chip 200' is mounted before the conductive structures 140 are formed, the conductive structures 140 and the electrode pads 210' may be formed simultaneously.

Figure 25:
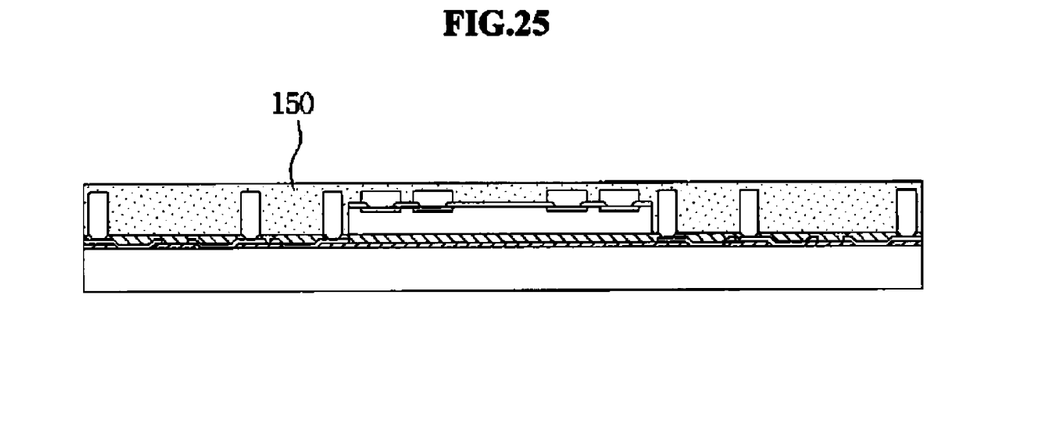
Figure 26:
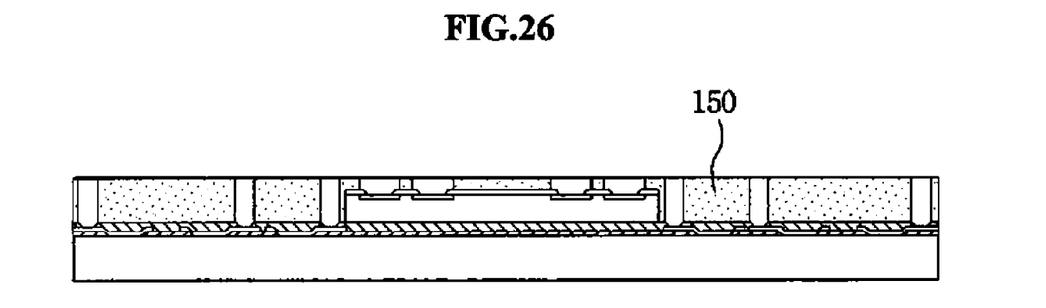
Figure 27:
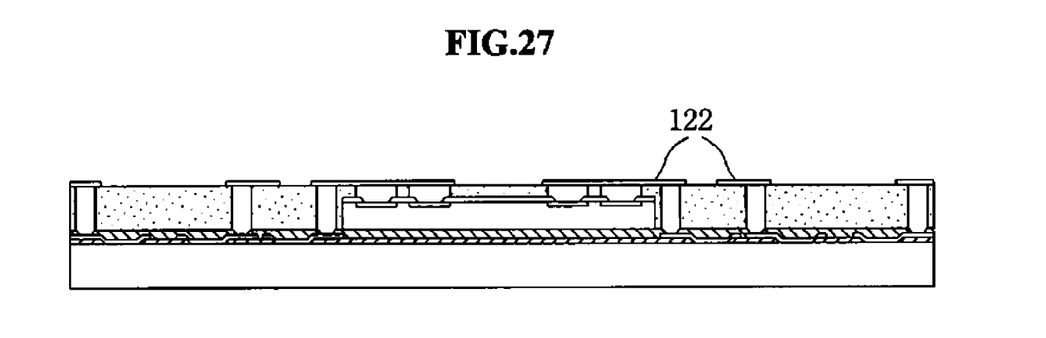

After the semiconductor chip 200', the conductive structures 140 and the electrode pads 210' are formed, a molding material is coated to the top side of the multilayer thin film layer, to form a molding part 150 at least partially covering the semiconductor chip 200', the conductive structures and the electrode pads 210' (FIG. 25). When the surface of the molding part 150 is over the top sides of the conductive structures 140 and the electrode pads 210', the top side of the molding part 150 is grinded to reduce the whole package (FIG. 26). When the top side of the molding part 150 is grinded, there is the advantage in that the height of each conductive structure 140 in the post shape and the height of the electrode pads 210' on the top side of the semiconductor chip 200' are uniformed.

Figure 28:
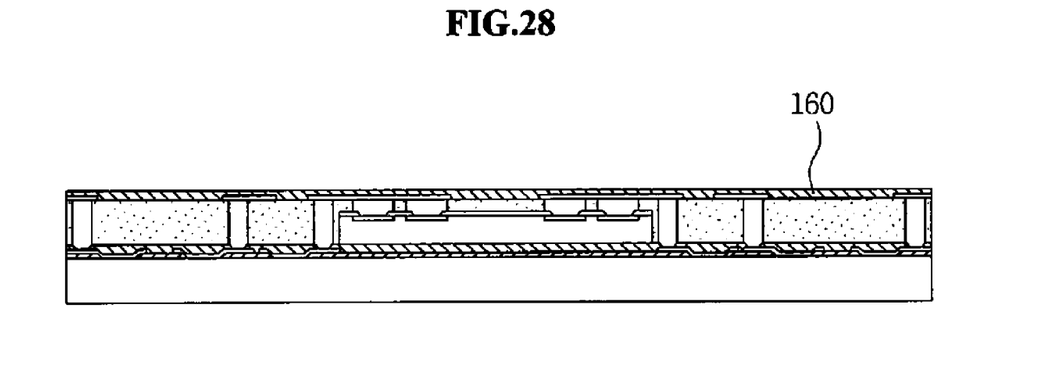
Figure 29:
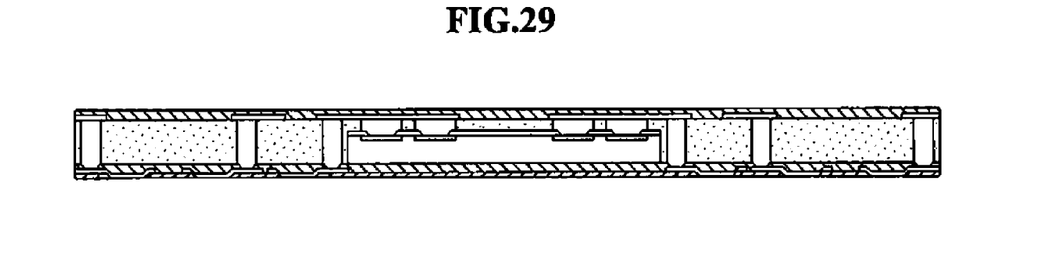

Subsequently, another redistribution layer 122 is formed to electrically connect the conductive structures 140 and the electrode pads 210' (FIG. 27), and another dielectric layer 160 as a protection layer is formed on the top side of the redistribution layer 122 (FIG. 28).

Figure 30:
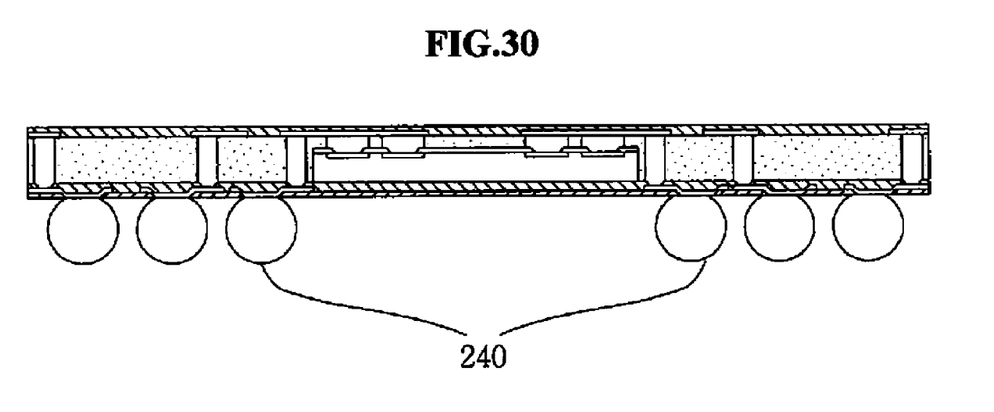

After the package structure including the multilayer thin film layer and the molding part 150 is completed, the wafer 100 under the multilayer thin film layer is removed (FIG. 29), and solder bumps 240 connected to the redistribution layer 120 of the multilayer thin film layer are formed for external connection (FIG. 30).

Comparing to the semiconductor package according to the first embodiment, the finally-completed semiconductor package according to the second embodiment has a similar structure except for the different method of mounting the semiconductor chip.

As described above, in accordance with the present invention, since the multilayer thin film layer and the molding part function as the substrate for the semiconductor package, an ultra slim semiconductor package is realized without any substrate. Since a plurality of the semiconductor packages are simultaneously formed at wafer level or carrier level, the process is simplified and it is favorable for mass production. The ultra slim semiconductor package according to the present invention is contributed to small and slim communication devices, displays, and other various electronic devices and has the excellent electrical characteristic to increase the product competitiveness.

The invention has been described using preferred exemplary embodiments. However, it is to be understood that the scope of the invention is not limited to the disclosed embodiments. On the contrary, the scope of the invention is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

The invention claimed is:

1. An ultra slim semiconductor package comprising:
   a multilayer thin film layer including a first dielectric layer, a first redistribution layer on the first dielectric layer, and a second dielectric layer on the first redistribution layer;
   at least one semiconductor chip electrically connected to the first redistribution layer and mounted on the multilayer thin film layer;
   conductive structures electrically connected to the first redistribution layer and each formed in a post shape at one side of the multilayer thin film layer;
   a molding part formed on the multilayer thin film layer and at least partially covering the conductive structures and the semiconductor chip;
   a second redistribution layer on the top side of the molding part;
   a third second dielectric layer directly formed on the second redistribution layer;
   bumps for external connection formed on the molding part and electrically connected to the conductive structures through the second redistribution layer,
   wherein the bumps are adapted to be mounted on a circuit board, the bumps extending below a lowermost surface of the third dielectric layer;
   wherein substantially all of the bumps are disposed such that they do not overlap with a top side of the semiconductor chip;
   wherein the top side of the molding part has the same height as the top side of the semiconductor chip; and
   wherein, at one side of the semiconductor chip, a heat spreader is positioned between the bumps for external connection.

2. The ultra slim semiconductor package of claim 1, wherein the semiconductor chip is electrically connected to the multilayer thin film layer by additional solder bumps.

3. The ultra slim semiconductor package of claim 2, wherein the solder bumps are electrically connected to the conductive structures of the multilayer thin film layer through the first redistribution layer.

4. The ultra slim semiconductor package of claim 1, wherein the multilayer thin film layer comprises a thin film passive device.

5. The ultra slim semiconductor package of claim 1, further comprising:
   another semiconductor package to be stacked on or under the semiconductor package.

6. The ultra slim semiconductor package of claim 5, wherein the two stacked semiconductor packages are electrically connected to each other by the bumps for external connection, and the bumps for external connection of the two packages are different in size.

7. The ultra slim semiconductor package of claim 1, wherein two or more semiconductor chips are electrically connected to the first redistribution layer and are mounted on the multilayer thin film layer, and the semiconductor chips are arranged to each other horizontally or vertically.

8. The ultra slim semiconductor package of claim 1, wherein the first redistribution layer and the second redistribution layer are symmetrically placed at both side of the molding part.

9. The ultra slim semiconductor package of claim 1, wherein the conductive structure has a tapered portion extending above the molding part and extending through the first dielectric layer.

10. The ultra slim semiconductor package of claim 1, wherein the package contains only a single semiconductor chip therein.

\* \* \* \* \*